(12) United States Patent
Ugge et al.

(10) Patent No.: US 11,150,275 B2
(45) Date of Patent: Oct. 19, 2021

(54) SENSING APPARATUS FOR SENSING CURRENT THROUGH A CONDUCTOR AND METHODS THEREFOR

(71) Applicant: Everspin Technologies, Inc., Chandler, AZ (US)

(72) Inventors: Angelo Ugge, Chandler, AZ (US); Markus Schwickert, Scottsdale, AZ (US); David Hayner, Waco, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 138 days.

(21) Appl. No.: 16/681,907

(22) Filed: Nov. 13, 2019

(65) Prior Publication Data

US 2020/0081037 A1   Mar. 12, 2020

Related U.S. Application Data

(62) Division of application No. 15/251,082, filed on Aug. 30, 2016, now abandoned.
(Continued)

(51) Int. Cl.
*G01R 15/20* (2006.01)
*G01R 33/00* (2006.01)

(52) U.S. Cl.
CPC .......... *G01R 15/20* (2013.01); *G01R 15/207* (2013.01); *G01R 33/0005* (2013.01)

(58) Field of Classification Search
CPC ... H01L 43/04; G01R 33/005; G01R 19/0092; G01R 33/0094; G01R 33/091; G01R 33/072; G01R 15/148
See application file for complete search history.

(56) References Cited

U.S. PATENT DOCUMENTS

| 5,473,244 A | 12/1995 | Libove et al. |
| 6,891,431 B2 | 5/2005 | Beer et al. |

(Continued)

FOREIGN PATENT DOCUMENTS

| CN | 1768263 A | 5/2006 |
| CN | 103454597 A | 12/2013 |

(Continued)

OTHER PUBLICATIONS

Takahiro Yamashita, Thin Film Based Flexible Current Clamp Sensor for Green Wireless Sensor Networks, Mar. 2014, IEEE (Year: 2014).*

(Continued)

*Primary Examiner* — Son T Le
*Assistant Examiner* — Dustin R Dickinson
(74) *Attorney, Agent, or Firm* — Bookoff McAndrews, PLLC

(57) ABSTRACT

A sensing apparatus for characterizing current flow through a conductor includes a plurality of magnetic sensors. In some embodiments, the sensors are grouped in pairs to achieve common mode rejection of signals generated in response to magnetic fields not resulting from current flow through the conductor. Sensors having different levels of sensitivity are used to collect information regarding the magnetic field generated by the current flowing through the conductor, where such information is processed in order to characterize the magnetic field. In some cases the sensors are included on or in flexible material that can be wrapped around the conductor.

20 Claims, 8 Drawing Sheets

Related U.S. Application Data

(60) Provisional application No. 62/271,833, filed on Dec. 28, 2015.

(56) References Cited

U.S. PATENT DOCUMENTS

| | | | |
|---|---|---|---|
| 8,390,283 | B2 | 3/2013 | Mather et al. |
| 9,679,235 | B2 * | 6/2017 | Sugar ................ G06K 19/0716 |
| 9,689,903 | B2 | 6/2017 | Sharma et al. |
| 9,970,962 | B2 | 5/2018 | Hsu et al. |
| 2004/0066209 | A1 | 4/2004 | Beer et al. |
| 2005/0156587 | A1 | 7/2005 | Yakymyshyn et al. |
| 2006/0091993 | A1 | 5/2006 | Shoji |
| 2007/0167703 | A1 | 7/2007 | Sherman et al. |
| 2010/0026286 | A1 | 2/2010 | Koss et al. |
| 2010/0194384 | A1 | 8/2010 | Hammerschmidt |
| 2013/0099775 | A1 | 4/2013 | Mitsuya |
| 2013/0162245 | A1 | 6/2013 | Tamura |
| 2014/0138346 | A1 | 5/2014 | Whig et al. |
| 2014/0218018 | A1 | 8/2014 | Ivanov et al. |
| 2015/0177337 | A1 | 6/2015 | Yamashita et al. |
| 2015/0323568 | A1 | 11/2015 | Schmitt |
| 2016/0202291 | A1 * | 7/2016 | Gilbert ................ G01R 15/181 324/750.25 |
| 2017/0184635 | A1 | 6/2017 | Ugge et al. |

FOREIGN PATENT DOCUMENTS

| | | |
|---|---|---|
| CN | 104303066 A | 1/2015 |
| EP | 2472272 A2 | 7/2012 |
| JP | 2009210406 A | 9/2009 |

OTHER PUBLICATIONS

International Preliminary Report on Patentability and Written Opinion issued in PCT International Application No. PCT/US2016/064941 dated Jul. 3, 2018, 9 pages.

Chinese Office Action in corresponding Chinese Application No. 201680014146.9, dated Apr. 14, 2020 (9 pages).

* cited by examiner

SENSING APPARATUS FOR SENSING CURRENT THROUGH A CONDUCTOR AND METHODS THEREFOR

RELATED APPLICATIONS

This application is a divisional of U.S. patent application Ser. No. 15/251,082, filed Aug. 30, 2016, which claims priority to and the benefit of U.S. Provisional Application No. 62/271,833, filed Dec. 28, 2015, all of which are incorporated by reference in their entireties.

TECHNICAL FIELD

The disclosure herein relates generally to magnetic sensors, and, more particularly, to using magnetic sensors to characterize current flowing through a conductor.

BACKGROUND

There are various ways to measure an electrical current, including, but not limited to, use of a shunt resistor, a current transformer, or a magnetic sensor. Shunt resistors provide a voltage proportional to a current flowing through the shunt resistor, which is in series with a load. In some cases, a shunt resistor provides an accurate reading with a low offset. However, shunt resistors are not electrically isolated from the load, and current sensors using shunt resistors can be damaged when exposed to large currents.

A current transformer includes primary and secondary coils. The primary coil carries a primary current to be measured, and the primary coil, via the primary current, induces a magnetic field in the secondary coil. A current is generated in the secondary coil that is proportional to the primary current scaled by a turns ratio, which relates to the number of loops of the primary and secondary coils. While a current transformer offers electrical isolation, a current transformer is generally large and bulky.

Magnetic sensors measure current based on the principles of Maxwell's equations, which provide that the magnitude of a magnetic field generated by the flow of current through, e.g., a conductor is (a) inversely proportional to a distance from the center of the conductor to the point of measurement, and (b) proportional to the current flowing in the conductor. When used to measure current, magnetic sensors provide electrical isolation and relatively accurate current readings. In addition, magnetic sensors have relatively low power consumption, good reliability characteristics, and suffer little degradation over time in comparison to the other types of current sensors.

While magnetic sensors provide good reliability and generally accurate current readings, their dynamic range is limited. Magnetic sensors designed to sense small currents are typically overwhelmed by much larger currents and unable to provide any useful information regarding such larger currents other than the current is greater than a maximum level of current the sensor is capable of measuring. Similarly, sensors designed to measure larger currents may be unable to provide useful information regarding very small currents.

Thus, it is desirable to provide a magnetic sensor-based sensing apparatus for characterizing current flow through a conductor that is less susceptible to external magnetic fields unrelated to the current flow, where the sensing apparatus has a wide dynamic range useful for varying levels of current.

DETAILED DESCRIPTION

Figure 1:
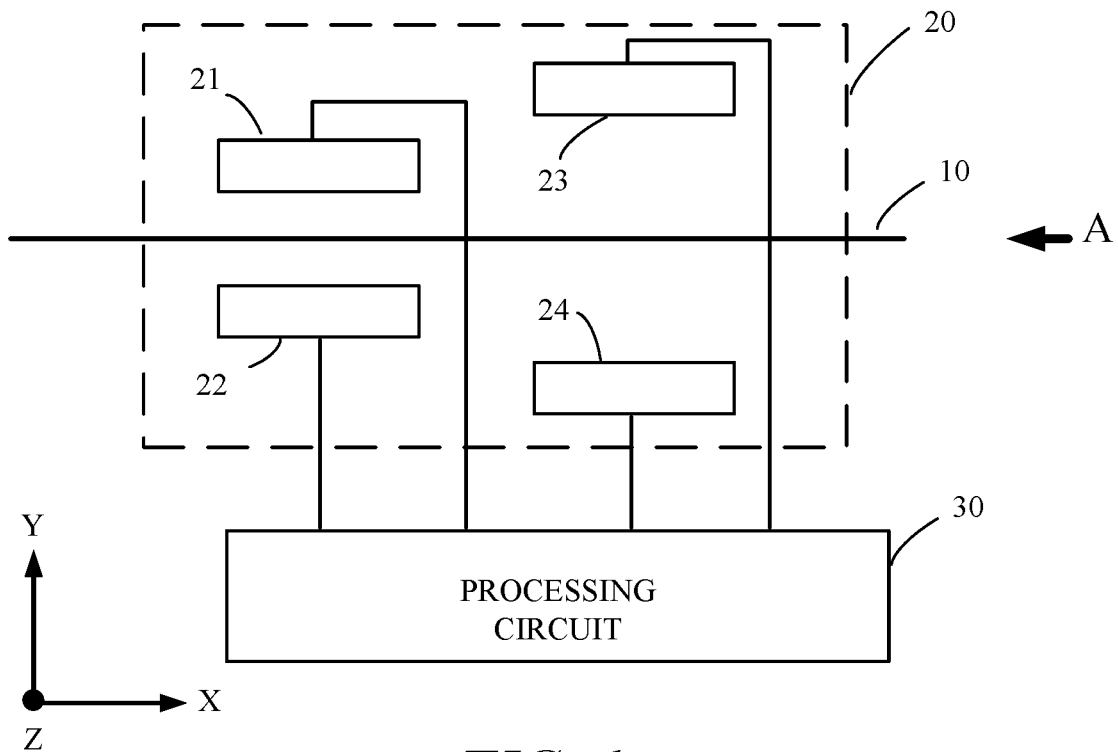
FIG. 1 is a block diagram of a current sensing apparatus in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, the physical composition of magnetic sensors, production of such sensors, fundamental principles of magnetism, basic operational principles of magnetic sensor devices, and basic electronics.

During the course of this description, like numbers may be used to identify like elements according to the different figures that illustrate the various exemplary embodiments.

For the sake of brevity, the functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

Magnetic sensors sense magnetic field in one or more directions. Such magnetic sensors typically have a dynamic range in which they are operable to provide meaningful information regarding a magnetic field to which they are exposed. For example, if the magnetic field is so small that it is outside the dynamic range of the magnetic sensor, the sensor does not generate any output information regarding such a field that is below its sensing threshold. Similarly, if the magnetic field is so great that it saturates the magnetic sensor, the magnetic sensor outputs information indicating that it is sensing a magnetic field having a magnitude that is equal to or greater than the high end of the dynamic range of the magnetic sensor. When the magnetic field is within the dynamic range of the sensor, the magnetic sensor generates output information that is based on the magnetic field. For example, the magnetic sensor may provide an analog output where the magnitude of the output is proportional to the magnitude of the magnetic field as detected by the sensor and the sign of the output indicates a positive or negative direction of the magnetic field with respect to the directional axis to which the magnetic field is referenced.

As described in more detail below, embodiments are disclosed herein that employ a plurality of magnetic sensors arranged in an array. In some embodiments, the sensors are arranged in pairs, where each pair of magnetic sensors allows for common mode rejection of external magnetic fields that are unrelated to the current being measured. In some embodiments, the array of magnetic sensors includes a plurality of pairs of magnetic sensors, where different pairs of sensors have different levels of sensitivity to the magnetic field corresponding to the current to be measured. For example, in some embodiments, the magnetic sensors of a first pair of sensors are spaced a first distance from the conductor, while the sensors in a second pair are spaced a second, greater distance from the conductor such that the sensitivity of the second pair to the magnetic field generated by current through the conductor is reduced by the added distance. In other embodiments, the orientation of the magnetic sensors in a second pair of sensors may be adjusted such that the magnetic field is perceived differently than a first pair of sensors such that the second pair of sensors is less sensitive to the magnetic field.

In other embodiments, the composition of the sensors in each pair of sensors is different such that, even if spaced an equal distance from the conductor, sensitivity to the magnetic field for each pair of sensors in the sensor array is varied. For example, sensors in a second pair of sensors may be sized or constructed to include materials that make those sensors less sensitive to the magnetic field of the conductor such that those sensors have a different dynamic range than a first pair of sensors. In yet other embodiments, buffering materials are included in the sensor array to adjust the sensitivity of certain sensors in order to shift their dynamic range with respect to the magnetic field generated by the current through the conductor. Notably, these different techniques for adjusting the sensitivity of the sensors to the magnetic field (different distance, different orientation, different composition, supplemental buffering materials, etc.) can be combined in various combinations to achieve the desired variation in sensitivity for the sensors in the array. Having sensors with different levels of sensitivity to the magnetic field generated by the current provides for an expanded dynamic range for the overall sensor array. Small currents that generate small fields can be characterized by sensors having high levels of sensitivity, whereas larger currents whose fields saturate the sensors with high sensitivity can be characterized by sensors having lower levels of sensitivity that are not overwhelmed by the higher-magnitude magnetic fields generated by the larger currents.

Also disclosed herein is processing circuitry used to combine the information provided by the plurality of sensors in the sensor array to produce the desired characterization information regarding the current flow through the conductor. Such processing circuitry, which can be implemented as discrete hardware, software executing on a processor, or a combination thereof, determines which sensors are providing useful input and combines the input from multiple sensors to generate characterization data regarding the current flow. Such characterization data can include, for example, the presence/absence of current, magnitude of the current, and direction of the current flow. As discussed in more detail below, in some embodiments, the processing circuitry is included on the same substrate as the sensor array, whereas in other embodiments the processing circuitry is implemented on a separate substrate from the array. In yet other embodiments, such processing circuitry can be included on more complex integrated circuits or circuit boards along with additional processors or related circuitry. For example, the processing circuitry can be designed as an application specific integrated circuit (ASIC) that is included on a printed circuit board or a standard cell that can be dropped into an integrated circuit design that includes other circuit elements. The processing may also be realized with the use of software on a processor connected to the sensor array.

Other example embodiments are presented in which the sensor array is disposed in or on a length of flexible material that can be wrapped around or otherwise mounted to a conductor. Tie-wraps and tapes with embedded or mounted sensors are described below in which the relative placement of the sensors with respect to the conductor is varied based on the positioning of the sensors in/on the flexible material and the manner in which the flexible material is attached to the conductor. In some embodiments, the flexible material includes an output port or other circuitry to provide the sensor information to processing circuitry apart from the flexible material, whereas in other embodiments, the processing circuitry is included on the flexible material. Embodiments with the sensor array in or on the flexible material provide adaptive current sensors that can easily be applied to a variety of different sized conductors.

FIG. 1 illustrates a sensor array 20 coupled to a processing circuit 30. The sensor array 20, which includes magnetic sensors 21-24, is placed on or near conductor 10 in order to detect and characterize current flow in conductor 10. In some embodiments, the sensor array 20 and the conductor 10 are included on the same substrate, whereas in other embodiments, conductor 10 is on a different substrate or is a stand-alone conductor such as a wire. In some embodiments, the sensor array is included in a structure designed to receive the conductor 10 in a manner that ensures the conductor 10 is properly positioned with respect to the sensors 21-24 in order to enable the sensors 21-24 to provide useful information regarding the magnetic field generated by current flowing through the conductor 10. For example, the structure on which the sensor array 20 is included may include a trench or hole for insertion of a wire. In other examples, mounting points included on the sensor array structure help position the sensor array 20 relative to the conductor 10. In yet other embodiments, each of the sensors 21-24 is a separate structure that has been positioned relative to the other sensors in order to form the array.

Each of the magnetic sensors 21-24 senses magnetic field in at least one direction. For example, in one embodiment, each of the magnetic sensors 21-24 is a uniaxial sensor that senses magnetic field in a direction perpendicular to the conductor. For example, each sensor may sense magnetic field having flux lines that extend directly into and out of the page, which is shown to correspond to the Z-axis in FIG. 1. In other embodiments, each of magnetic sensors 21-24 is a multi-axial magnetic sensor that is capable of detecting magnetic fields in multiple directions. For example, while a uniaxial magnetic sensor may detect magnetic field going into and coming out of the page (Z-axis), a multi-axial magnetic sensor may also detect magnetic fields in a right-to-left direction corresponding to the X-axis, and/or in the up-and-down direction corresponding to the Y-axis. Such multiaxial magnetic sensors can be formed using sets of uniaxial sensors positioned in different orientations. In other embodiments, such multi-axial magnetic sensors may be formed together in a single plane where flux guides are used to redirect magnetic field relative to the plane in which the sensors are formed to enable sensing of magnetic fields that normally would not be perceptible within the plane the magnetic sensors are formed. Such flux guides and multi axis magnetic sensors are discussed in U.S. Pat. No. 8,390,283, issued Mar. 5, 2013, and entitled "Three Axis Magnetic Field Sensor," which is incorporated by reference herein. Further details regarding example magnetic sensors are discussed in U.S. Patent Application Publication No. 2014/0138346, published May 22, 2014, and entitled "Process Integration of a Single Chip Three Axis Magnetic Field Sensor," which is also incorporated by reference herein. In some embodiments, each magnetic sensor 21-24 is formed using unshielded magnetoresistive sensing elements that are electrically coupled together in a Wheatstone bridge configuration. Such a configuration is also discussed in detail in U.S. Pat. No. 8,390,283. In some embodiments, a single die having sensors corresponding to multiple axes is used where the sensors corresponding to some of the axes are ignored in characterizing the current through the conductor. For example, a three-axis magnetic field sensor such as those described in U.S. Pat. No. 8,390,283 can be used where the X- and Y-axis sensors are disregarded and only information from the Z-axis sensors are used.

As shown in FIG. 1, magnetic sensors 21 and 22 are positioned closer to conductor 10 then magnetic sensors 23 and 24. If a spatial axis is defined as running through the center of the conductor 10 (or the position where conductor 10 is expected to be inserted) and in the direction of the current flow through conductor 10, each magnetic sensor in the first pair of magnetic sensors 21, 22 is positioned a first distance from the spatial axis corresponding to the conductor and each magnetic sensor in the second pair of magnetic sensors 23, 24 is positioned a second distance from the spatial axis, where the second distance is greater than the first distance. As such, any magnetic field generated by current flowing through conductor 10 will have a greater impact on magnetic sensors 21 and 22 then it will on magnetic sensors 23 and 24 as the strength of the magnetic field is inversely proportional to the distance from the point of origin of the magnetic field to the point where the field is sensed. As such, while each of the magnetic sensors 21-24 may be substantially similar in construction, magnetic sensors 23 and 24 are described as "less sensitive" to the magnetic field generated by current flowing through the conductor 10 based on their positioning further away from the conductor 10. As such, the sensor array 20 depicted in FIG. 1 includes a first pair of sensors 21 and 22 that have a first level of sensitivity with respect to the magnetic field generated by current through the conductor 10 and a second pair of sensors 23 and 24 that have a second level of sensitivity with respect to the magnetic field generated by current through the conductor 10, where the second level of sensitivity is less than the first level of sensitivity.

In operation, when a current flows through conductor 10, thereby resulting in a magnetic field being generated, each of the sensors 21-24 may or may not generate relevant information based on the magnetic field. For example, if a small current is flowing through conductor 10 such that a small magnetic field is generated, the perception of that magnetic field by sensors 21 and 22 may be sufficient to result in those sensors generating information regarding the strength and direction of the magnetic field, whereas sensors 23 and 24 may be too far from the conductor 10 to perceive the magnetic field to a degree that results in the generation of useful information. Conversely, a strong magnetic field resulting from a much larger current in conductor 10 can saturate magnetic sensors 21 and 22, whereas magnetic sensors 23 and 24, having reduced sensitivity to the magnetic field based on their more distant positioning with respect to conductor 10, are able to generate relevant output information regarding that magnetic field as they are not saturated. In yet another example, the current through the conductor 10 may be such that the resulting magnetic field is perceived by all of magnetic sensors 21-24 and is within the dynamic range of each of those sensors 21-24 such that all four sensors are able to provide output information regarding the magnetic field. In such an example, the magnetic field does not result in any of the magnetic sensors 21-24 being saturated, yet the field is of sufficient magnitude to be perceived and evaluated by each of the sensors 21-24.

The processing circuit 30 included in FIG. 1 receives the information generated by each of the magnetic sensors 21-24 and evaluates that information in order to provide characterization data regarding the magnetic field being generated by the current flowing through conductor 10, and thus, characterization data regarding the current itself. The processing circuit 30 determines whether each of the sensors 21-24 is providing relevant information regarding the magnetic field, and, once the relevant information has been selected for further processing, the processing circuit 30 is configured to process that information to generate the characterization data regarding the current flow through the conductor 10. For example, the processing circuit 30 can determine that the first pair of magnetic sensors 21 and 22 are saturated, thereby indicating that the magnitude of the magnetic field is beyond the dynamic range of sensors 21 and 22. As such, the processing circuit will omit or give no weight to the information provided by the first pair of magnetic sensors from the relevant information that it selects for further processing to characterize the current flow through the conductor 10. In such an example, the processing circuit 30 may also determine that the sensors 23 and 24 are not saturated, and in fact are providing relevant information regarding the magnetic field being generated by the current through the conductor 10. As such, the processing circuit can analyze the information provided by sensors 23 and 24, while omitting the information provided by sensors 21 and 22, to characterize the current flowing through conductor 10.

In another example, the processing circuit 30 determines that both the first pair of magnetic sensors 21 and 22 and the second pair of magnetic sensors 23 and 24 are operating within their respective dynamic ranges and are not saturated by the magnetic field being generated by the current flowing through conductor 10. As a result, the processing circuit 30 can use the information being provided by all of the magnetic sensors 21-24 in characterizing the current flow through the conductor 10. For example, the processing circuit 30 may perform a weighted average with respect to the information received from the sensors 21-24 in order to arrive at the characterization data for the current flowing through conductor 10. Such a weighted average may take into account the different levels of sensitivity of the magnetic sensors 21-24.

In some embodiments, a calibration procedure is used to refine the characterization data generated by the processing circuit 30. For example, a known current can be sent through the conductor 10, where the processing circuit 30 generates characterization data corresponding to that known current based on initial parameter settings within the processing circuit 30. Calibration methods can then be used to adjust those parameter settings in order to provide characterization data aligned with the known current flowing through the conductor 10. For example, a 1 Amp current may be sent through conductor 10, where the initial characterization data produced by the processing circuit 30 indicates that the sensing apparatus is detecting a current of 0.9 Amps flowing through the conductor 10. As a result, parameters included in or referenced by the processing circuit 30 can be adjusted such that the characterization data produced by the processing circuit 30 more accurately reflects the actual current flowing through the conductor 10. It should be appreciated that in some embodiments, such calibration may not be necessary based on the tolerances with respect to the current characterization that are acceptable for the particular application. In other embodiments, calibration at many different levels of current through the conductor 10 is performed in order to ensure that the sensing apparatus is properly calibrated throughout a wide dynamic range and can therefore characterize currents of both low and high magnitude.

Figure 2:
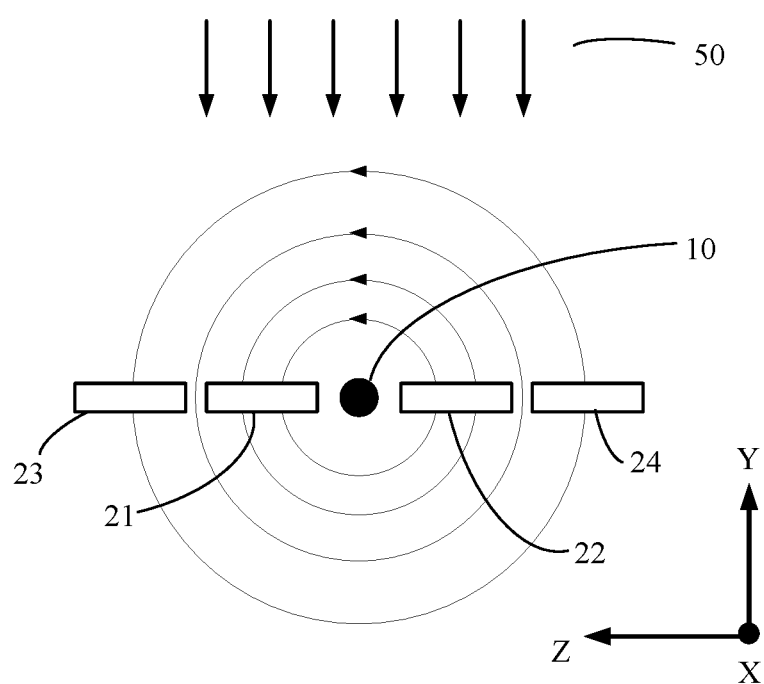
FIG. 2 is a block diagram providing a perspective view of a portion of the current sensing apparatus of FIG. 1 in accordance with an exemplary embodiment.
Figure 3:
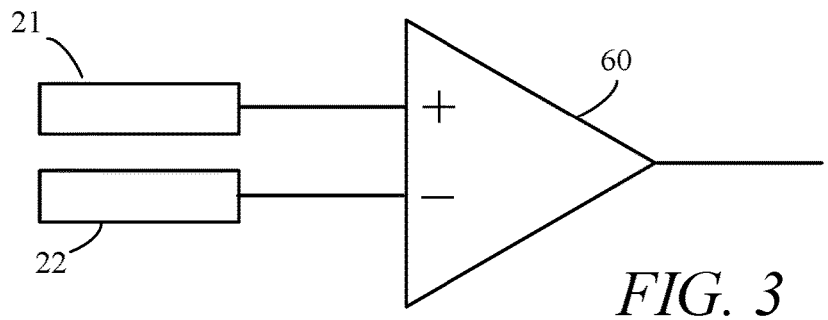
FIG. 3 is a block diagram of a current sensing apparatus in accordance with an exemplary embodiment.

FIG. 1 shows the sensor array 20 including a plurality of pairs of magnetic sensors. The magnetic sensors 21-24 are grouped in pairs in order to provide common mode rejection with respect to external magnetic fields perceived by the magnetic sensors 21-24 that are not generated as a result of current flow through the conductor 10. FIG. 2 provides a different perspective view of the conductor 10 and magnetic sensors 21-24. The view presented in FIG. 2 corresponds to the perspective view indicated by the arrow labeled "A" in FIG. 1. In the example illustrated, the sensors 21-24 are positioned in the same plane with conductor 10. The magnetic field generated by the current through conductor 10 is represented by concentric circles around conductor 10. Assuming the current is along the X-axis and coming out of the page in FIG. 2, the right-hand rule indicates the magnetic field corresponding to that current is oriented in a counter-clockwise direction such that sensors 21 and 23 perceive magnetic field in a downward (−Y) direction, whereas magnetic sensors 22 and 24 perceive magnetic field in an upward (+Y) direction. Assuming the magnetic sensors 21 and 22 are placed the same distance away from conductor 10, are composed of the same materials, and have the same structure, those matched sensors 21 and 22 should perceive the same amount of magnetic field, but with opposite polarity, resulting from the current through the conductor 10. FIG. 2 also shows an external magnetic field 50 directed in a downward direction, where the magnetic field 50 is unrelated to the current flowing through the conductor 10. In order to prevent magnetic field 50 from adversely influencing the characterization of the current flow through conductor 10 by the sensing apparatus, the magnetic sensors 21-24 are grouped in differential pairs, such that the influence of the magnetic field 50 on one of the sensors within each differential pair cancels out the influence of the magnetic field 50 on the other sensor within the differential pair. Thus, while magnetic sensors 21 and 22 perceive the magnetic field associated with the current flowing through conductor 10 as having opposite polarity, both magnetic sensors 21 and 22 perceive magnetic field 50 in the same manner (i.e. as having the same magnitude and direction). As such, by providing the output information from magnetic sensors 21 and 22 to a differential amplifier 60 as shown in FIG. 3, the contributions to the output information generated by sensors 21 and 22 in response to external magnetic field 50 cancel out.

In order to provide optimal common mode rejection of signals resulting from the detection of an external magnetic field such as field 50, the magnetic sensors 21 and 22 are preferably symmetrically aligned to the field 50, relative to the conductor 10. In the case illustrated in FIG. 2, this would correspond to points that are about 180° apart on a virtual circle having a center corresponding to the conductor 10. In other words, the sensors are placed on opposite sides of the conductor. However, in other embodiments, the positioning of magnetic sensors 21 and 22 need not be as precise, as a lower level of rejection of such common mode signals resulting from external magnetic fields may be acceptable. Similarly, sensors 23 and 24 can be placed 180° apart on a larger virtual circle having a center corresponding to the conductor 10. In some embodiments, the first virtual circle corresponding to magnetic sensors 21 and 22 and the second virtual circle corresponding to magnetic sensors 23 and 24 are concentric virtual circles line lying in a common plane that is perpendicular to the spatial axis for the conductor. In other embodiments, the virtual circles may be offset such that the center of the first virtual circle is positioned at a first point on the spatial axis for the conductor, whereas the center of the second virtual circle is positioned at a second, different point on the spatial axis.

Notably, while FIGS. 1 and 2 show the magnetic sensors 21-24 grouped in pairs, other embodiments do not require such matched sets of magnetic sensors. For example, if external magnetic fields are not a significant concern, a simpler embodiment can include only magnetic sensors 21 and 23, where each of magnetic sensors 21 and 23 provides a different level of sensitivity with respect to the magnetic field generated by current flowing through the conductor 10. Thus, while such an embodiment would lack the common mode rejection of undue influences from external magnetic fields, it would still provide a sensor array with a wider dynamic range than is supported by a single magnetic sensor. As discussed below, the sensor array can include a large number of sensors, thereby providing a very wide dynamic range with respect to sensing currents of different amplitudes. In such embodiments that do not fully support common mode rejection of external magnetic fields, the processing circuit 30 can still analyze the information provided by the plurality of sensors in the array to determine which sensors are providing relevant information regarding the magnetic field resulting from the current flow through the conductor 10 and process that information accordingly in order to characterize the current through conductor 10.

Figure 4:
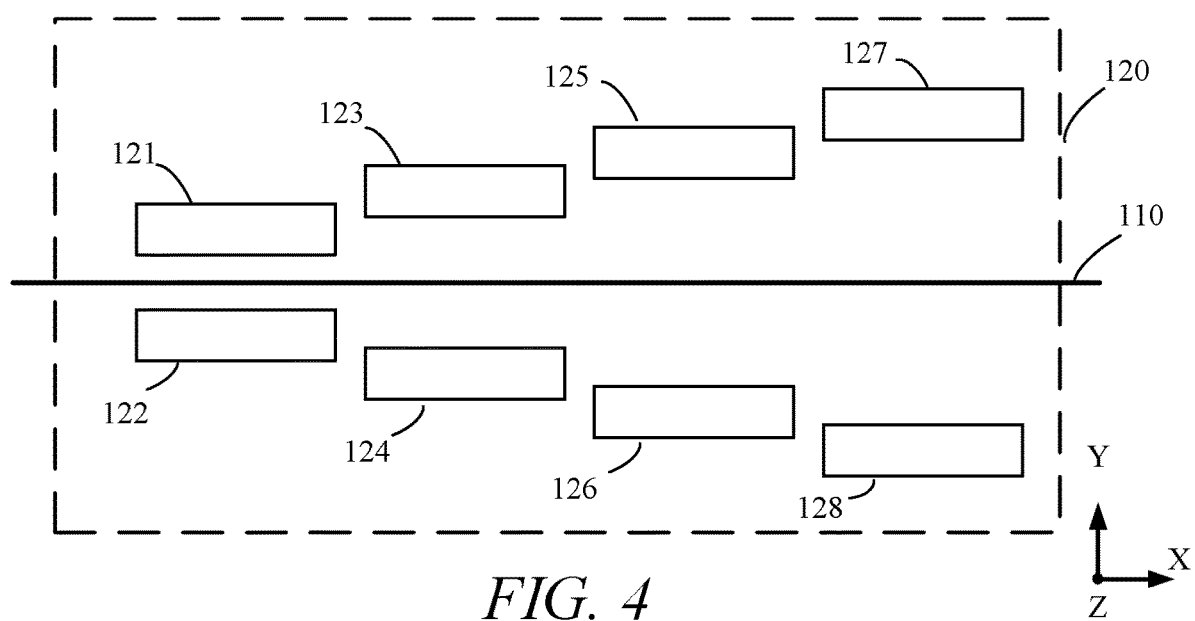
FIGS. 4-6 are block diagrams showing magnetic sensor arrays in accordance with exemplary embodiments.

FIG. 4 illustrates a sensor array 120 that includes a plurality of magnetic sensors 121-128. A horizontal line represents the expected positioning of a conductor 110 through which current flows that results in a magnetic field. As shown, current flow is along the X-axis. As discussed above, the conductor 110 may be disposed on the same substrate as the sensor array, or it may be a separate wire or trace to which the sensor array is affixed or otherwise relatively positioned. As illustrated in FIG. 4, the first pair of magnetic sensors 121 and 122 includes magnetic sensors that are each positioned a first radial distance from a spatial axis corresponding to the conductor 110. Similarly, magnetic sensors 123 and 124 constitute a second pair of magnetic sensors positioned a second radial distance from the spatial axis corresponding to the conductor 110, where the second radial distance is greater than the first radial distance. Magnetic sensors 125 and 126 form a third pair of magnetic sensors positioned at a third radial distance from the spatial axis, and magnetic sensors 127 128 form a fourth pair of magnetic sensors positioned at a fourth radial distance from the spatial axis. As shown, the fourth radial distance is greater than the third radial distance, and the third radial distance is greater than the second radial distance. While the sensor array 120 depicted in FIG. 4 includes four pairs of magnetic sensors where each pair includes magnetic sensors positioned at successively greater distances from the conductor 110, it should be appreciated that the sensor array 120 can include any number of pairs of magnetic sensors. Embodiments with greater numbers of sensors can be used to provide a wider dynamic range and better resolution within that dynamic range.

As discussed above with respect to FIG. 1, processing circuitry can be coupled to the pairs of magnetic sensors 121-128 included in the sensor array 120, where the processing circuitry is configured to select information received from a least one of the pairs of magnetic sensors as representative information that can be used to characterize the current flow within the conductor. The processing circuitry receives the information from each of the magnetic sensors 121-128 and determines which of the sensors 121-128 are providing relevant information for characterizing the current flow through the conductor 110. Magnetic sensors that are saturated can be ignored or given no weight, whereas the information from magnetic sensors operating within their dynamic range is used to characterize the current flow through the conductor 110. In some embodiments, the processing circuitry only relies on information received from a single pair of magnetic sensors, whereas in other embodiments, the processing circuitry can combine the information provided by two or more pairs of magnetic sensors in order to arrive characterization data for the current through the conductor 110.

Figure 5:
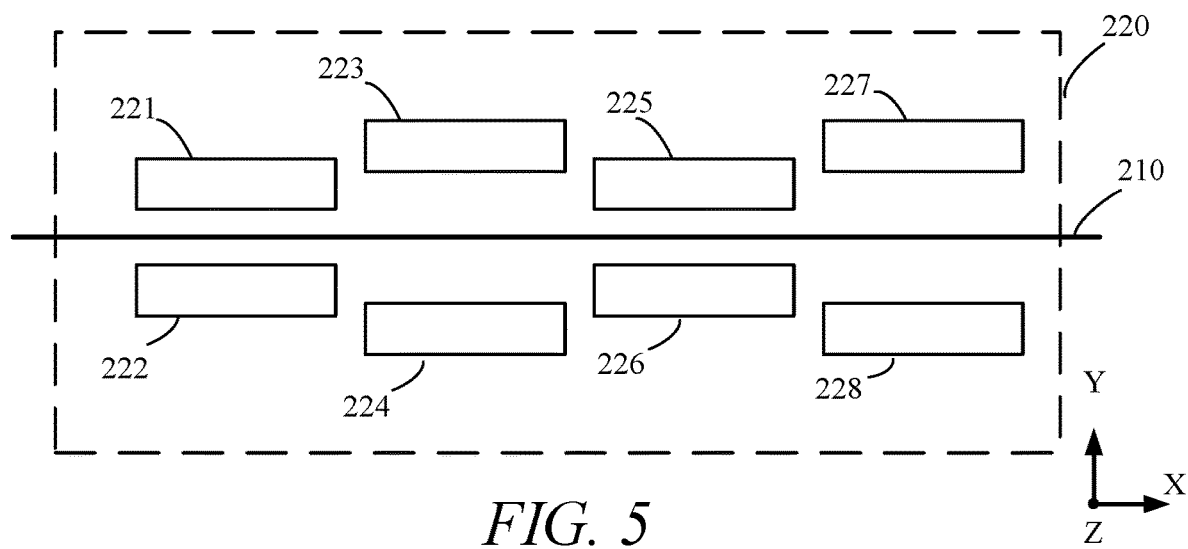

FIG. 5 illustrates another example of a sensor array 220, where sensor array 220 includes a plurality of magnetic sensors 221-228. Magnetic sensors 221-228 are positioned relative to conductor 210 in order to detect a magnetic field generated by current flowing through conductor 210 along the X-axis. As shown in FIG. 5, the sensor array 220 includes multiple pairs of magnetic sensors, and some of the pairs of magnetic sensors are positioned a same radial distance along the Y-axis from the spatial axis corresponding to the conductor 210, which, as shown in FIG. 5, is the X-axis. In some embodiments all of the sensors 221-226 are positioned in a common plane with respect to the Z-axis. For example, magnetic sensors 221 and 222 are positioned a first radial distance from the conductor 210, and magnetic sensors 225 and 226 are positioned the same first radial distance away from the conductor 210. Similarly, magnetic sensors 223 and 224 are positioned the same distance away from the conductor 210 as sensors 227 and 228.

The embodiment depicted in FIG. 5 provides multiple magnetic sensors having the same or similar sensitivity with respect to the magnetic field flowing through the conductor 210. Thus, magnetic sensors 221 and 225 should perceive about the same magnetic field and generate about the same output information in response to current flowing through the conductor 210. However, imperfections in the sensors or materials surrounding the sensors can lead to detection errors that can impact the ability of the sensor array 220 to be used to accurately characterize the current flow through the conductor 210. As such, providing additional magnetic sensors within the sensor array 220 having the same sensitivity as other sensors in the sensor array 220 allows the corresponding processing circuitry to average the input from sensors having the same or similar levels of sensitivity in order to reduce or minimize detection errors. FIG. 5 illustrates multiple pairs of magnetic sensors in which some of the pairs have different spacing from the conductor 210, and therefore different degrees of sensitivity with respect to the magnetic field generated by current flowing through the conductor 210. In other embodiments, the sensor array may only include a plurality of pairs of magnetic sensors in which all of the magnetic sensors have the same sensitivity. For example, all of the sensors can be spaced equally distant from the spatial axis corresponding to the conductor 210. In such an embodiment, the dynamic range of the overall sensor array may not be expanded beyond the dynamic range for each individual sensors, however, the presence of redundant pairs of sensors allows corresponding processing circuitry to average the information received from those sensors to arrive at a more accurate characterization of the current flow through the conductor 210.

Figure 6:
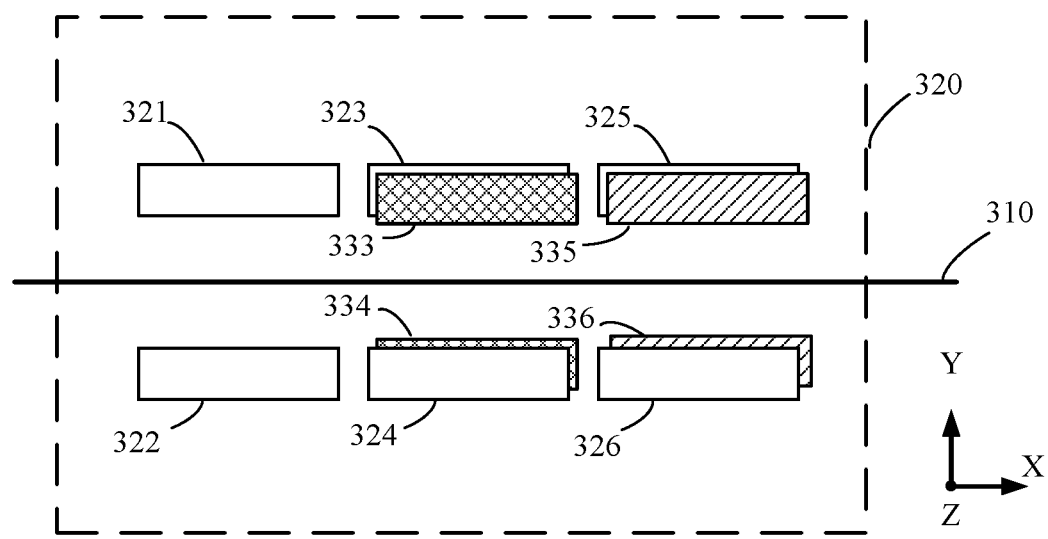

FIG. 6 illustrates a sensor array 320 that includes magnetic sensors 321-326. The sensor array 320 includes pairs of magnetic sensors that are equally spaced with respect to the conductor 310. Instead of varying the sensitivity of the sensors 321-326 by varying their positions with respect to the conductor 310, in some embodiments, the sensitivity of the magnetic sensors 321-326 is varied by varying the composition of magnetic sensors 321-326. In other embodiments, buffering material can be selectively added to the sensor array 320 in order to reduce the sensitivity of certain magnetic sensors within the sensor array.

For example, in some embodiments, sensors 323 and 324 may be different in composition then sensors 321 and 322 such that sensors 323 and 324 are less sensitive to the magnetic field generated by the current flowing through conductor 310. Thus, although sensors 323 and 324 are positioned just as close to conductor 310, their reduced sensitivity provides the same advantages as having magnetic sensors 323 and 324 positioned further away from conductor 310 as the dynamic range of sensors 323 and 324 is different from that of sensors 321 and 322. As such, while a larger current may cause sensors 321 and 322 to saturate, the reduced sensitivity of sensors 323 and 324 may allow them to continue to operate within their dynamic range, thereby providing relevant information to allow the current through conductor 310 to be characterized. Providing sensors with different composition can include providing sensors having a different size, a different shape, or sensors that include different materials.

In other embodiments, each of the sensors 321-326 has the same composition, however additional buffering material 333-336 is added to certain sensors within the sensor array 320 in order to reduce their sensitivity with respect to the magnetic field generated by the current flowing through the conductor 310. For example, sensors 323 and 324 may be positioned near buffering materials 333 and 334 that reduce the sensitivity of magnetic sensors 323 and 324 to the magnetic field, thereby giving them a different dynamic range than sensors 321 and 322. For sensors 325 and 326, a thicker layer of such buffering material may be employed, or a different type of buffering material may be used that is more effective in reducing sensitivity of the magnetic sensors 325 and 326. As a result, magnetic sensors 325 and 326 are even less sensitive to the magnetic field than sensors 323 and 324.

In yet other embodiments, the sensitivity of sensors in the array can be adjusted by changing the orientation of the sensors with respect to the direction of the magnetic field to be sensed. For example, a sensor placed perpendicular to the direction of magnetic field to be sensed may have the maximum level of sensitivity to that field, whereas when the sensor is angled slightly away from perpendicular, the sensitivity is reduced. As such, having pairs of sensors oriented slightly differently can provide an array of sensors with different levels of sensitivity to a particular magnetic field.

As described above, the sensitivity of sensors within the sensor array can be controlled using a variety of techniques in order to provide sensors having different dynamic ranges with respect to detection of the magnetic field generated by current flowing through a conductor. Such techniques include spacing the sensors at different distances from conductor, changing the orientation of the sensor with respect to the direction of magnetic field to be sensed, changing the composition (e.g. size, shape, materials) of the sensor, and adding additional buffering materials that reduce the sensitivity of the sensors. While these techniques have been generally presented as being used separately in the different embodiments discussed above, one of ordinary skill in the art appreciates that such sensitivity control techniques can be combined in various ways in order to produce a sensor array having a wide variety of sensors with different levels of sensitivity.

Figure 7:
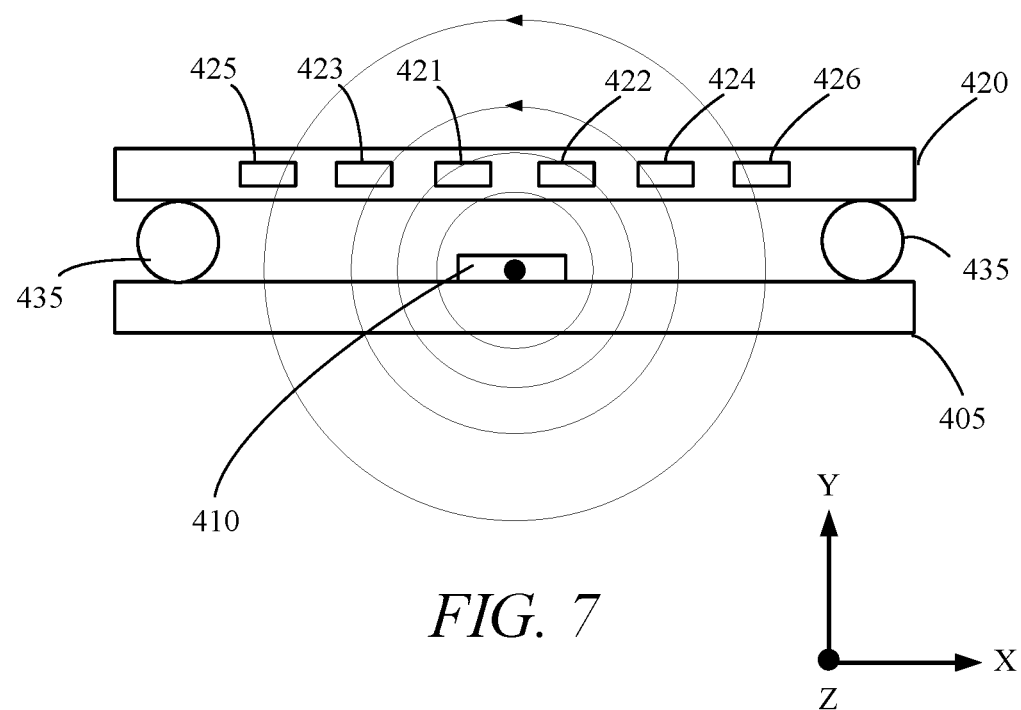
FIG. 7 is a block diagram showing a sensing apparatus mounted to a circuit that includes a current-carrying trace in accordance with an exemplary embodiment.

FIG. 7 illustrates an example embodiment that includes a sensor array 420 mounted to a substrate 405, which, in some embodiments is a printed circuit board or integrated circuit. Substrate 405 is shown to include a conductor 410. In some embodiments, the conductor 410 is a trace on the surface of the substrate 405, whereas in other embodiments, the conductor 410 is embedded within the substrate 405. In the example embodiment shown in FIG. 7, the sensor array 420 includes a plurality of sensors 421-426 that are included on a separate substrate from the substrate 405. For example, the structure shown in FIG. 7 may be a multichip module that includes one integrated circuit that includes the sensor array 420 is mounted to a second integrated circuit 405 that includes the conductor 410. Such mounting can be facilitated by mounting points 435, which, in some embodiments are solder pins on a package corresponding to one of the integrated circuits.

The sensor array 420 can be used to characterize current flow through the conductor 410. As depicted, current is flowing through the conductor 410 in a direction coming out of the page, which, for the sake of illustration is assumed to correspond to the Z-axis. As such, the flux lines corresponding to the magnetic field generated by that current are shown to be counterclockwise in direction. In the example shown in FIG. 7, the close placement of the sensor array 420 to the conductor 410 can result in the magnetic field generated by the current through the conductor 410 having different directional components corresponding to different axial directions as perceived by each of the sensors 421 through 426. Assuming the vertical direction corresponds to the Y-axis, sensors 425 and 426 perceive magnetic field resulting from the current through conductor 410 that is generally in the Y direction. In contrast, sensors 421 and 422 perceive magnetic field with a main component that is horizontal and parallel to the X-axis.

In such an embodiment, sensors capable of sensing magnetic field in different directions can be included within the sensor array 420. In one example, sensors 421 and 422 are uni-axial sensors that only sense magnetic field in the X direction, whereas sensors 425 and 426 sense magnetic field in only the Y direction. In other embodiments, each of the magnetic sensors 421-426 is a multi-axial sensor capable of sensing magnetic field in both the X and Y directions. In yet other embodiments, each of the magnetic sensors 421-426 is a three-way multi-axial sensor capable of sensing magnetic field in each of the X, Y, and Z directions.

While not shown in FIG. 7, a processing circuit, which may be included on substrate 420 or substrate 405, can be configured to receive the information generated by the sensor array 420 and process that information in order to characterize the current flow through the conductor 410. By including magnetic sensors having sensing capabilities in multiple directions, scenarios, such as that illustrated in FIG. 7, in which there is a need to sense the different directional components of the magnetic field are addressed.

Figure 8:
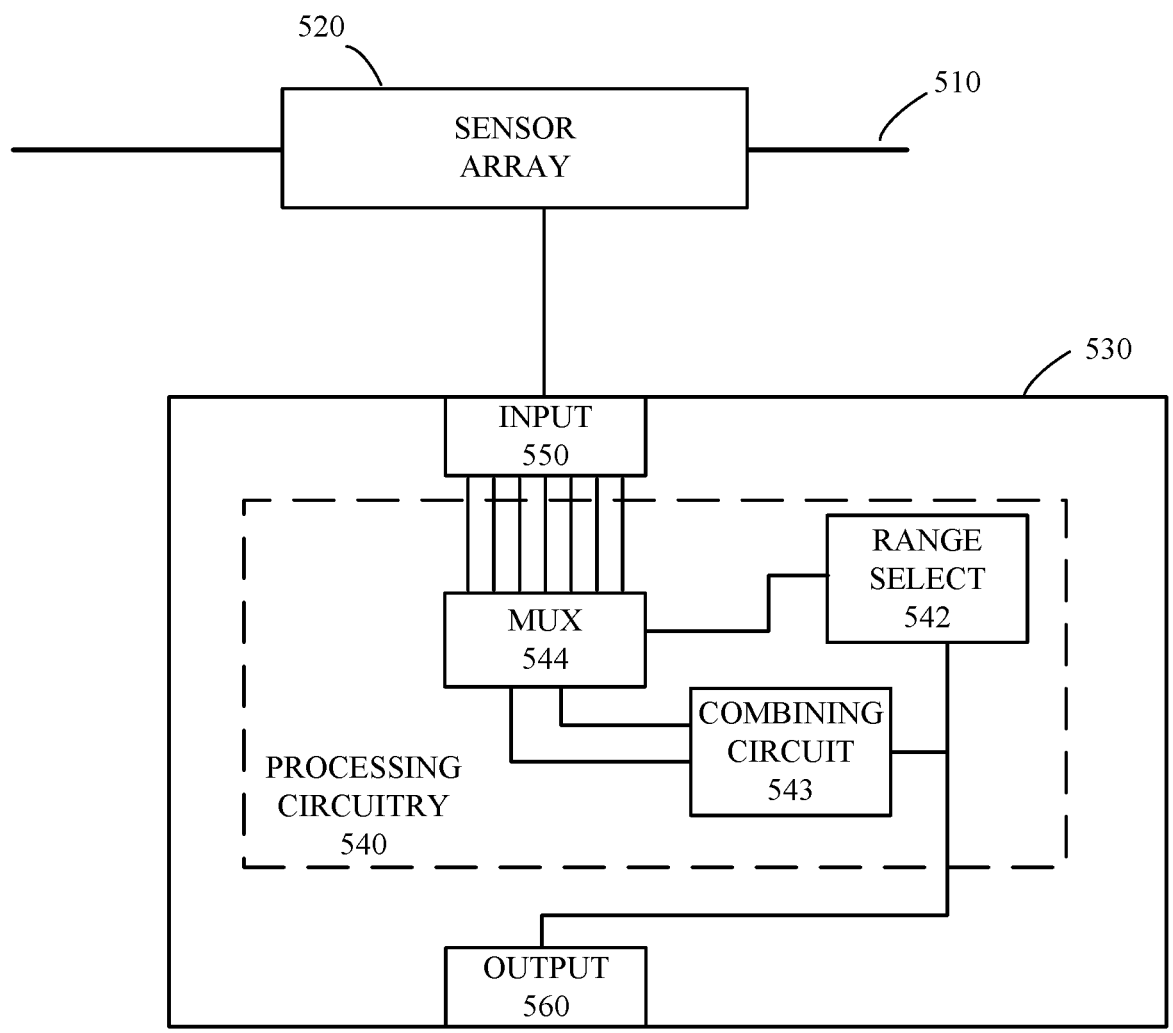
FIG. 8 is a block diagram of a current sensing apparatus in accordance with an exemplary embodiment.

FIG. 8 illustrates a block diagram corresponding to a sensing apparatus that includes a sensor array 520 coupled to circuitry 530, where circuitry 530 is used to characterize current flow through a conductor 510. As discussed above, conductor 510 can be included on the same substrate as sensor array 520, or, in other embodiments, can be separate from the sensor array 510. The sensor array 520 is positioned relative to the conductor 510 in order to allow the sensors included in the sensor array 520 to detect and measure the magnetic field generated by current flowing through the conductor 510. Similarly, the circuitry 530 can be included on the same substrate is the sensor array 520, or may be disposed on a separate substrate.

Sensor array 520 includes a plurality of sensors arranged in an array such as those discussed above with respect to FIGS. 1-7. Thus, the sensors included in the sensor array 520 can include pairs of sensors position at different distances from the conductor 510, sensors having different sensitivity based on their composition, etc. The sensors included in sensor array 520 can be discreet devices, devices all formed on an integrated circuit, or devices arranged on a printed circuit board.

Circuit 530, which is used for characterizing current flow through the conductor 510, includes input circuitry 550, processing circuitry 540, and output circuitry 560. Input circuitry 550 is configured to receive information from the magnetic sensors in the sensor array 520. The processing circuitry 540 is coupled to the input circuitry 550 and is configured to select relevant information from the information received from the magnetic sensors in the sensor array 520 and process that relevant information to generate characterization data regarding the current flow through the conductor 510. As noted above, selecting relevant information from the information received can include determining which magnetic sensors in the sensor array 520 are saturated and omitting information from those sensors. Such selection can also include determining that magnetic sensors are not saturated and are detecting magnetic field within their dynamic range. Information from such magnetic sensors can be included in the relevant information processed to characterize the current flow. Selection of the relevant information can be accomplished using the multiplexer 544 that is controlled by a range select circuit 542. A combining circuit 543 can be used to combine multiple sets of information corresponding to multiple sensors in the sensor array 520. The range select circuit 542 controls the multiplexer 541 and selects which sets of information from which sensors are passed through to the combining circuit 543. The range select circuit 542 receives the output of the combining circuit 543. As such, the range select circuit can select and evaluate the information received from individual sensors or sets of sensors in order to determine which sensors are providing information to be included in the relevant information used to characterize the current flow through the conductor 510.

After the range select circuit 542 has determined which sensors are providing useful relevant information that will be used to characterize the current flow through the conductor 510, the output from the combining circuit 543 outputs the characterization data corresponding to the current flowing through the conductor 510. In some embodiments, the output produced by the circuit 530 is an analog indication of the current flow through the conductor 510, whereas in other embodiments, the output is digital in format.

In some embodiments, the circuit 530 is composed of discrete components implemented on printed circuit board. In other embodiments, the circuit 530 is included on a single integrated circuit, where that integrated circuit may also include other processing circuitry such as a microcontroller or processor that manages current flow through conductors in a system. For example, in an automotive system, sensor arrays such as sensor array 520 can be used to monitor the flow of current through various conductors in the control and power systems for the automobile, where a processor includes the circuitry for managing the numerous systems within the automobile. Such a processor can also include the circuit 530 that is used to monitor current flow in different portions of the automobile using one or more sensor arrays. In some embodiments, portions of the circuit 530 may be shared with other components in the system. For example, the range selection circuit 542 may correspond to a microprocessor executing code that examines the output of the combining circuit 543 and controls the multiplexer 544.

Figure 9:
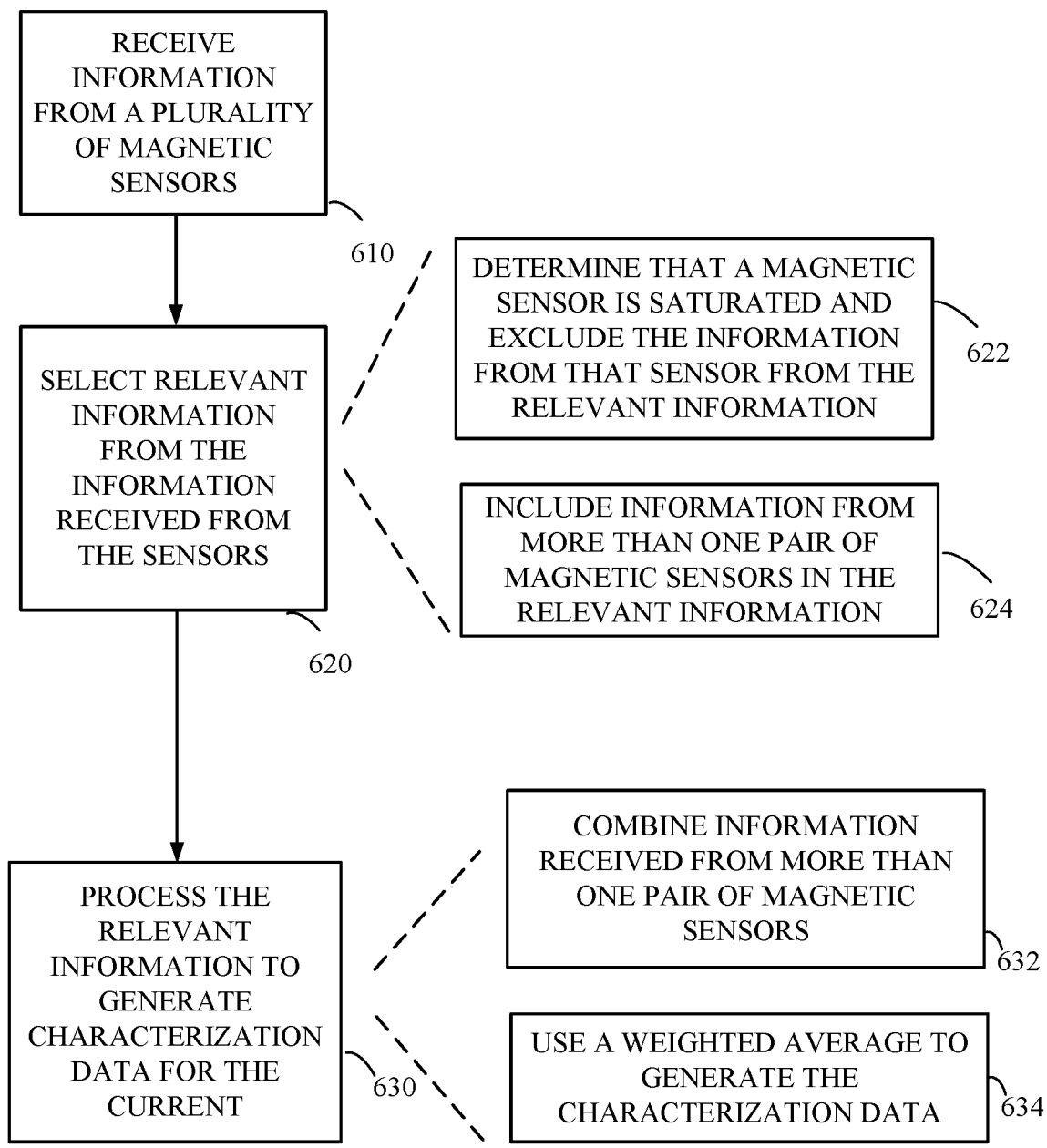
FIG. 9 is a flow chart illustrating a method for characterizing current flowing through a conductor in accordance with an exemplary embodiment.
Figure 10:
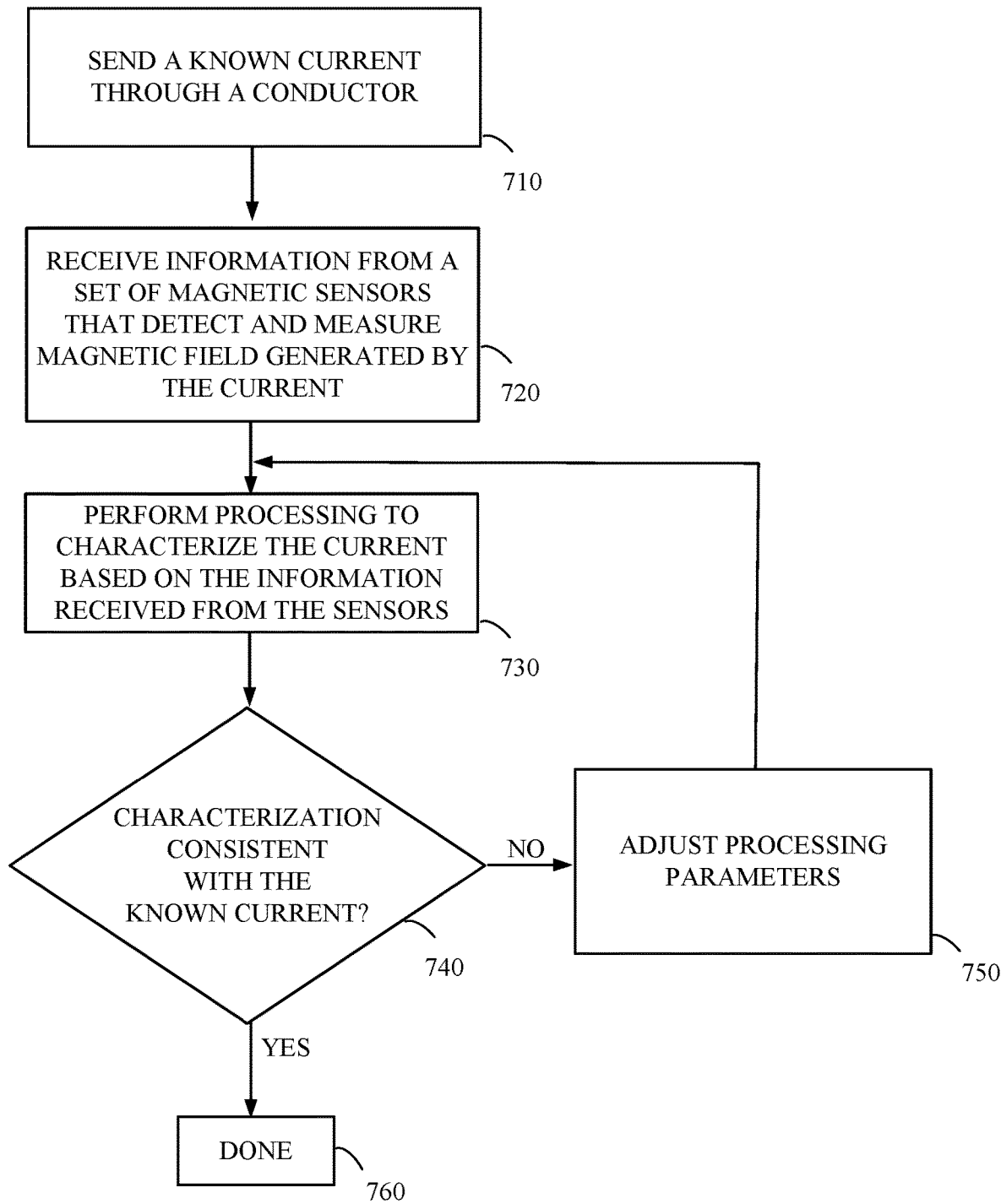
FIG. 10 is a flow chart illustrating a method for calibrating a sensing apparatus in accordance with an exemplary embodiment.

FIGS. 9 and 10 are flow charts that illustrate exemplary embodiments of methods relating to characterization of current flow through a conductor using an array of magnetic sensors. The operations included in the flow charts may represent only a portion of the overall process used in characterizing current flow. For illustrative purposes, the following description of the methods in FIGS. 9 and 10 may refer to elements mentioned above in connection with FIGS. 1-8. It should be appreciated that the methods may include any number of additional or alternative tasks, the tasks shown in FIGS. 9 and 10 need not be performed in the illustrated order unless specified otherwise, and the methods may be incorporated into a more comprehensive procedure or process having additional functionality not described in detail herein. Moreover, one or more of the tasks shown in FIGS. 9 and 10 can be omitted from an embodiment as long as the intended overall functionality remains intact.

FIG. 9 illustrates a flow chart of a method for characterizing current flow through a conductor. At 610, information is received from a plurality of magnetic sensors. In some embodiments, the plurality of magnetic sensors includes sensors having a different levels of sensitivity, or a different dynamic range, with respect to sensing the magnetic field generated by current flowing through the conductor. For example, the plurality of magnetic sensors can be arranged in pairs where each pair of magnetic sensors includes a first sensor and a second sensor that are positioned at a predetermined distance from a spatial axis corresponding to the conductor, wherein the spatial axis corresponds to a direction of current flow within the conductor. In such an example, the sensors for different pairs can be positioned at different distances from the spatial axis.

At 620, relevant information is selected from the information received from the plurality of magnetic sensors. As discussed above, selecting the relevant information can include, at 622, determining that certain magnetic sensors of the plurality of sensors are saturated, where the information provided by such saturated magnetic sensors is excluded from the relevant information. As also discussed above, the relevant information selected at 620 can include, as shown at 624, information from more than one pair of magnetic sensors included in the plurality of sensors.

At 630, the relevant information is processed to generate characterization data regarding the current flowing through the conductor. At 632, such processing is shown to include combining the information received from more than one pair of magnetic sensors to arrive at the characterization data for the current. At 634, such a combination is shown to use a weighted average calculation, where different weighting can be apportioned to different sensors based on their level of sensitivity, which may be controlled based on positioning, structure of the sensor, etc.

FIG. 10 provides a flow chart corresponding to a method for performing a calibration operation in conjunction with a sensing apparatus such as those discussed above. At 710, a known current is sent through a conductor, where the conductor is positioned in a particular arrangement with a set of magnetic sensors that detect and measure the magnetic field generated by the current flowing through the conductor.

At 720, information is received from the set of sensors. At 730, processing is performed to characterize the current flowing through the conductor based on the information received from the sensors. As discussed above, the processing performed at 730 can include combining information received from multiple sensors in a manner that provides a wide dynamic range and avoids errors based on external magnetic fields or imperfections in the sensors.

At 740, it is determined whether or not the characterization data generated at 730 is consistent with the known current flowing through the conductor. For example, if the processing performed at 730 indicates that a certain current having a certain direction and magnitude is perceived as flowing through the conductor 710, and that perceived magnitude and direction is consistent with the actual current known to be flowing through the conductor, the sensor array, and the processing performed with respect to the sensor array, is determined to be properly calibrated. If the sensed current is consistent with the actual current, the method proceeds to 760 where calibration is complete.

If it is determined at 740 that the characterization of the current is not consistent with the actual current flowing through the conductor, processing parameters are adjusted at 750 in order to attempt to bring the characterization data in line with the data that should be expected based on the actual current flow. For example, the weighting with respect to certain sensors can be adjusted, or bias/offset values can be adjusted in order to align the characterization data with the current flow. After adjusting processing parameters at 750, the processing based on the information received from the sensors is repeated at 730, and the characterization data that results is once again checked at 740 to determine if it is now consistent with the actual current flowing through the conductor. Based on the comparison performed at 740, calibration is either completed at 760 or further adjustment to processing parameters occurs at 750.

Figure 11:
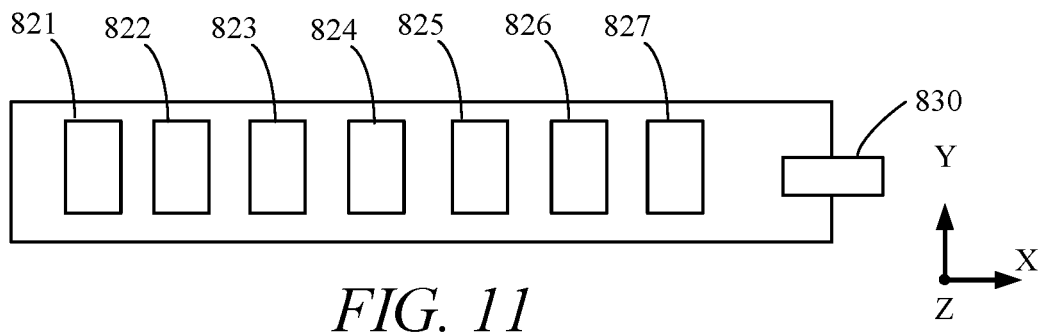
FIG. 11 is a block diagram of a sensor array included in a length of flexible material in accordance with an exemplary embodiment.
Figure 12:
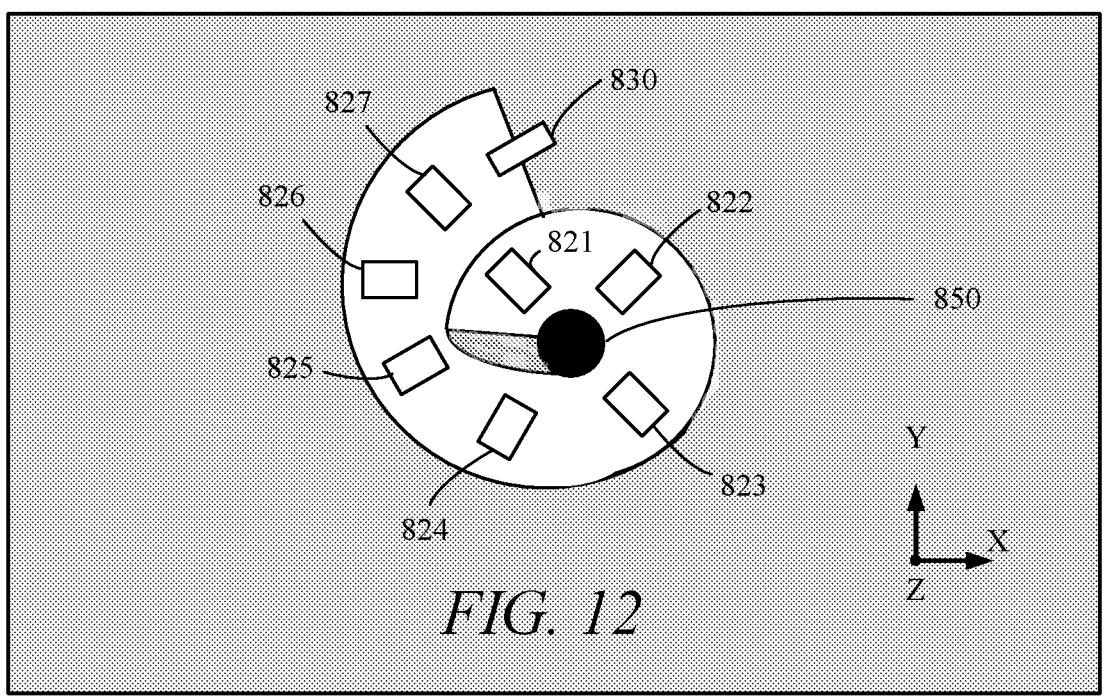
FIG. 12 is a block diagram of the sensor array of FIG. 11 wrapped around a conductor in accordance with an exemplary embodiment.

FIG. 11 illustrates a particular embodiment in which a plurality of sensors 821-827 are arranged within or on a length of flexible material 805. The thickness (dimension in the Y-direction) of the material 805 is preferably thin enough such that the flexible material 805 can be wrapped around a conductor. Such a wrapping of the flexible material 805 around a conductor 850 is shown in FIG. 12 in which the conductor lies in the Z-direction. In some embodiments, the flexible material 805 includes an adhesive such that the flexible material 805 functions in a manner similar to tape and is able to self-attach around the conductor 850. In other embodiments, the flexible material may be a tie wrap, which can also be referred to as a "zip tie" or "cable tie," such that the flexible material can be readily attached around the outside of a conductor. In yet other embodiments, the flexible material is foam insulation, and the magnetic sensors are included within the foam insulation.

Flexible material 805 is also shown to include a port 830, where the port 830 can be used to output the information collected by the sensors 821-827. In some examples, the port 830 is an electrical port into which an interface is plugged to allow the information from the sensors to be output. In other embodiments, the port 830 may include a Bluetooth interface, or some other wireless interface that allows data to be transferred from the flexible material 805 to a remote processor. In yet other embodiments, processing circuitry used to process the information generated by the sensors 821-827 is included in or on the flexible material 805. In such embodiments, the port 830 can be used to output processed characterization data corresponding to current flow through a conductor around which the flexible material 805 is wrapped. In yet other embodiments, a lights or a display are also included in or on the flexible material, where the lights or display are used to provide information regarding the current flow as characterized by the sensing apparatus. In order to provide power for circuits or devices on the flexible material, in some embodiments the flexible material includes circuit elements that scavenge power from the magnetic field the sensing array is designed to detect. Thus, in addition to measuring magnetic field generated by current flow through a conductor, the flexible material can tap into the energy of the magnetic field and generate power needed to operate various components that may be included in or on the flexible material. While this may slightly alter the current flow being detected, in many applications such an impact is inconsequential.

Figure 13:
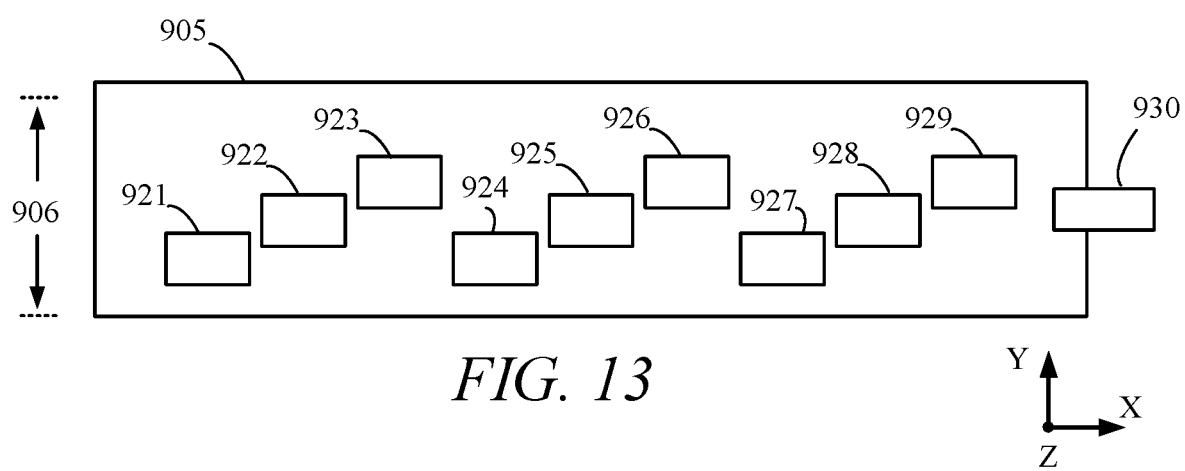
FIG. 13 is a block diagram of a sensor array included in a length of flexible material in accordance with an exemplary embodiment.

While FIG. 12 shows the flexible material wrapped around the conductor 850 multiple times such that there are multiple layers of sensors extending out from the conductor 850, in an example embodiment where the flexible material is similar to a tie wrap, only a single wrapping of the flexible material around the wire 850 may exist. Thus, while the embodiment illustrated in FIG. 12 provides for multiple magnetic sensors spaced at different distances from the conductor 850 based on the multiple wraps of the flexible material 805, embodiments such as a tie wrap may position the magnetic sensors differently within the flexible material in order to achieve a similar effect. Such an embodiment is shown in FIG. 13. FIG. 13 shows a length of flexible material 905 having a thickness 906 and in which magnetic sensors 921-929 are formed. Port 930 functions in a similar manner to port 830 described above with respect to FIG. 11.

When the flexible material 905 is wrapped around a conductor an array of magnetic sensors that around the conductor is established. As shown in FIG. 13, some of the magnetic sensors are positioned closer to a first side of the flexible material, whereas other magnetic sensors are positioned further away from the first side of the flexible material. Thus, when wrapped around the conductor, the magnetic sensors 921 and 924 that are close to the first side of the flexible material end up positioned closer to the conductor then the other magnetic sensors that are positioned at a different distance from the first edge within the flexible material 905. Thus, different magnetic sensors having different sensitivity to magnetic field generated by current flowing within the conductor are established when the flexible material 905 is wrapped around a conductor. As discussed above, the magnetic sensors included in the flexible material 805 and flexible material 905 can be formed to have different levels of sensitivity, where the sensitivity is controlled based on positioning of the sensor, the composition of the sensor, and the presence or absence of buffering material associated with the magnetic sensors. Thus, rather than including sensors spaced a different distance from the edge of the flexible material, sensors having different compositions or different sensitivities based on other factors can be included in the flexible material.

Processing circuitry is used to determine which of the magnetic sensors are providing useful information regarding the magnetic field generated by current flowing through the conductor around which the flexible material is wrapped. Determining which magnetic sensors are providing useful information can also include determining which magnetic sensors included in the flexible material end up in offset positions with respect to each other after the sensing apparatus is mounted to the conductor. For example, the processing circuitry can determine that certain pairs of magnetic sensors are such that they approximate offset pairs of magnetic sensors such as those shown in FIG. 1. For example, depending on the thickness of the wire, in the embodiment of FIG. 13, sensors 921 and 924 may comprise a closely matched pair of magnetic sensors in one instance, where magnetic sensors 921 and 927 present a better matched pair in another example. As noted above, an optimal pair of magnetic sensors would be equally spaced from the conductor and offset from each other by approximately 180° with respect to a circle having a center corresponding to the conductor. While a 180° relationship may not actually exist for sensors in the flexible material, the positioning of those sensors still provides significant common mode rejection with respect to external magnetic fields that could adversely impact characterization data for the current flow through the conductor. As such, additional processing that determines which of the magnetic sensors are best paired to provide common mode rejection with respect to external magnetic fields can be used in conjunction with the flexible material embodiments described herein.

Figure 14:
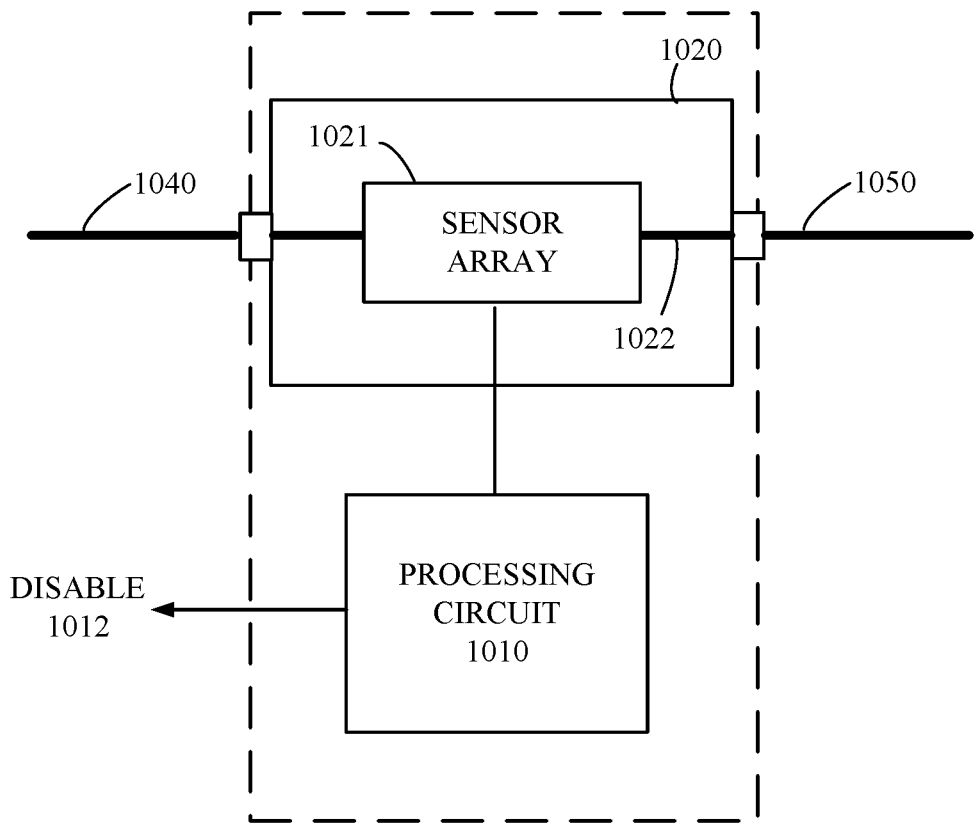
FIG. 14 is a block diagram of a sensing apparatus in accordance with an exemplary embodiment.

FIG. 14 illustrates yet another example embodiment in which a sensor array is used to monitor current flow through a conductor. The circuit 1005 includes a sensing apparatus 1020 and a processing circuit 1010. As shown, the circuit 1005 is spliced between conductors 1040 and 1050. Current flowing through conductors 1040 and 1050 also flows through conductor 1022. The sensor array 1021 is positioned with respect to the conductor 1022 such that magnetic field generated by the current flowing through conductor 1022 can be monitored by the sensor array 1021 as discussed above. The information generated by the sensor array 1021 is provided to processing circuit 1010. In some embodiments, processing circuit 1010 can, based on the information provided by the sensor array, detect when large spikes in current through conductor 1022 occur. In one example embodiment, the circuit 1005 is used to monitor current flow through a high-amperage conductor corresponding to a motor. Rather than including a fuse between conductors 1040 and 1050 that blows to generate an open circuit when too much current is applied, the circuit 1050 can used to ensure too much current does not flow through the conductors 1040 and 1050. By monitoring the current flow using the sensor array 1021, a disable signal 1012 can be asserted in order to avert the need to blow of physical fuse and interrupt the connection between conductors 1040 and 1050. Additional circuitry can then be used to reset the system or change certain parameters before the disable signal 1012 is de-asserted, thereby enabling current to once again flow through the conductors 1040 and 1050. While FIG. 14 depicts an example set of components used to monitor and disable current flow when too much current is detected, it is understood that other combinations of components can be used to perform the same or a similar function in other embodiments.

As discussed above, by including sensors with different levels of sensitivity to the magnetic field generated by the current flowing through the conductor 1022 in the sensor array 1021, a wide dynamic range for the current monitoring circuit 1005 can be achieved. Having the current monitoring circuit 1005 function as a fuse-like device can help to protect certain circuitry or other devices (e.g. the motor) in a manner that allows for easier recovery than is possible in a system in which a physical fuse is blown to create an open circuit.

Figure 15:
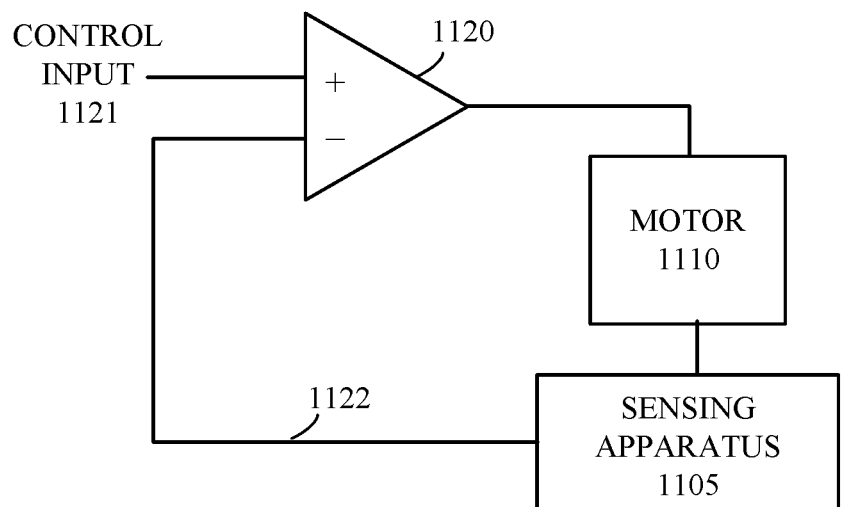
FIG. 15 is a block diagram of a sensor apparatus included in an example application in accordance with an exemplary embodiment.

FIG. 15 illustrates an embodiment in which a sensing apparatus is used in a "current loop" configuration in which the current through a motor 1110 is closely controlled based on a feedback loop. The circuit includes includes a motor 1110, an operational amplifier 1120, and a sensing apparatus 1105. The sensing apparatus 1105 generates a measure of the current flow through the motor 1110 and generates a signal 1122 that is fed back to the operational amplifier 1120. With a high-gain operational amplifier, this causes the current through the motor to track very closely to the control input 1121.

When a sensing apparatus similar to that shown with respect to FIG. 14 is employed in the circuit of FIG. 15, additional protection for the motor 110 can be achieved. If an undesirably high level of current is detected as flowing through the motor 1110 by the sensing apparatus 1105, a signal 1122 can be provided to the operational amplifier 1120 that overrides the control input 1121 and ensures that the motor 1110 is not damaged by an oversupply of current. Such a soft shut down can help to avoid damage to the motor 1110 while still allowing for a simple reactivation of the motor 1110 once the issue resulting in the excessive current is resolved.

As described herein, a plurality of magnetic sensors are arranged in an array with respect to a conductor that allows for varying perspectives on the magnetic field generated by current flowing through the conductor. In some embodiments, different levels of sensitivity for the magnetic sensors allow for a wider dynamic range for the sensor array then can be achieved with a single sensor. Arranging the sensors in pairs can be used to provide common mode rejection of signals corresponding to external magnetic fields unrelated to the current flowing through the conductor. The different levels of sensitivity for the magnetic sensors can be adjusted based on numerous techniques, including their positioning, orientation, composition, and the use of buffering materials that affect the sensitivity of the magnetic sensor to the magnetic field. Also disclosed are embodiments in which the magnetic sensors are included in lengths of flexible material that can be wrapped or otherwise flexibly placed around conductors within which current to be characterized is flowing. Such flexible material embodiments, such as zip ties, tapes, or other wraps, allow for quick positioning of a sensor array around a conductor, where the flexible material is adaptable to conductors of different diameters. Sensitivity of the sensors within the flexible material can be varied in order to provide an array of sensors having a large dynamic range suitable for many different applications.

Some embodiments described herein utilize multi-axial sensors that are included on a single substrate (e.g. on the same semiconductor die) such as those disclosed in U.S. Pat. No. 8,390,283. Having sensors corresponding to all of the X-, Y-, and Z-axes in a single plane corresponding to the surface of the die allows for easy placement of the sensors with respect to a conductor on a printed circuit board or other relatively flat surface. For example, the sensor die can simply be abutted to, or stacked on top of, the printed circuit board or die on which the conductor carrying current to be characterized resides. Such ease of placement is in sharp contrast to solutions in which a sensor must be placed perpendicular to the plane in which the conductor resides, such as a system in which separate, discrete X-, Y-, and Z-axes sensors must be physically placed in different orientations with respect to the conductor.

Providing sensors with very high sensitivity and accuracy in such embodiments allows for more precise current characterization with a wide dynamic range. Having sensors corresponding to multiple axes on the same die also requires less space than embodiments that utilize distinct sensors or sets of sensors for each axis, as such distinct-axis sensor embodiments may require the sensors for the different axes to be positioned in different planes with respect to each other. Having sensors corresponding to multiple axes on the same die also provides for a more flexible current sensor that can be used in a variety of applications, where the flexibility can promote high volume production that reduces cost. As noted above, varying the level of sensitivity of sensors used to characterize current flow can be achieved in many different ways. In some embodiments corresponding to multiple-axes sensor arrays, techniques may be employed that allow the sensitivity of sensors corresponding to one or more of the axes to be varied in a controlled manner while the sensors corresponding to the other axes are relatively fixed. For example, the sensitivity corresponding to the Z-axis can be varied while the sensors for the X-, and Y-axes are held constant or, in some embodiments, ignored.

Although the described exemplary embodiments disclosed herein are directed to a variety of arrangements of magnetic sensors, the present disclosure is not necessarily limited to the exemplary embodiments. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A sensing apparatus for sensing current through a conductor, the sensing apparatus comprising:
a plurality of magnetic sensors, wherein each magnetic sensor of the plurality of magnetic sensors has a sensitivity with respect to a magnetic field generated by the current through the conductor, wherein each magnetic sensor is positioned on a flexible material configured to be wrapped around the conductor in a spiral arrangement, and wherein the flexible material further includes a coupling port; and
wherein each magnetic sensor in the plurality of magnetic sensors senses magnetic field in a first direction, wherein the first direction corresponds to a first axis that is perpendicular to a spatial axis corresponding to the conductor, and wherein each magnetic sensor in the plurality of magnetic sensors also senses magnetic field in a second direction, wherein the second direction corresponds to a second axis that is i) perpendicular to the spatial axis corresponding to the conductor and ii) perpendicular to the first axis.

2. The apparatus of claim 1, further comprising processing circuitry coupled to the plurality of magnetic sensors, wherein the processing circuitry is configured to analyze magnetic field information received from at least one magnetic sensor of the plurality of magnetic sensors to determine whether any one of the plurality of magnetic sensors are saturated with magnetic field, wherein the processing circuitry is configured to omit the magnetic field information from any magnetic field sensor determined to be saturated with magnetic field, and wherein the processing circuitry is further configured to transmit information regarding the current flow within the conductor based only on magnetic field information from magnetic field sensors not saturated with magnetic field.

3. The apparatus of claim 1, wherein:
the plurality of magnetic sensors includes at least a first pair of magnetic sensors and a second pair of magnetic sensors,
wherein, when the flexible material is wrapped around the conductor, each magnetic sensor of the first pair of magnetic sensors is positioned a first distance from a spatial axis corresponding to the conductor, wherein the spatial axis corresponds to a direction of current flow within the conductor; and
wherein, when the flexible material is wrapped around the conductor, each magnetic sensor of the second pair of magnetic sensors is positioned a second distance from the spatial axis for the conductor, wherein the second distance is greater than the first distance.

4. The apparatus of claim 3, wherein the first pair of magnetic sensors has a first level of sensitivity, wherein the second pair of magnetic sensors has a second level of sensitivity, wherein the plurality of magnetic sensors further comprises a third pair of magnetic sensors, wherein, when the flexible material is wrapped around the conductor, each magnetic sensor of the third pair of magnetic sensors is positioned a third distance from the spatial axis for the conductor, wherein the third distance is greater than the second distance, and wherein a third level of sensitivity of magnetic sensors in the third pair of magnetic sensors is less than the second level of sensitivity.

5. The apparatus of claim 3, wherein, when the flexible material is wrapped around the conductor, the first pair of magnetic sensors includes:
a first magnetic sensor positioned at a first point on a first virtual circle having a radius equal to the first distance, wherein a center of the first virtual circle corresponds to the spatial axis for the conductor; and
a second magnetic sensor positioned at a second point on the first virtual circle.

6. The apparatus of claim 5, wherein the first and second points are about 180 degrees apart on the first virtual circle.

7. The apparatus of claim 5, wherein, when the flexible material is wrapped around the conductor, the second pair of magnetic sensors includes:
a third magnetic sensor positioned at a first point on a second virtual circle having a radius equal to the second distance, wherein a center of the second virtual circle corresponds to the spatial axis for the conductor; and
a fourth magnetic sensor positioned at a second point on the second virtual circle.

8. The apparatus of claim 7, wherein the first virtual circle and the second virtual circle are concentric virtual circles lying in a common plane perpendicular to the spatial axis for the conductor.

9. The apparatus of claim 7, wherein the center of the first virtual circle is positioned at a different point on the spatial axis for the conductor than the center of the second virtual circle.

10. The apparatus of claim 3, wherein each magnetic sensor of the first pair of magnetic sensors has a different composition than each magnetic sensor of the second pair of sensors.

11. The apparatus of claim 3, wherein each magnetic sensor of the first pair of magnetic sensors has a same composition as each magnetic sensor of the second pair of sensors, and wherein the sensing apparatus further comprises a buffering material positioned with respect to the second pair of magnetic sensors such that the buffering material reduces sensitivity of each of the magnetic sensors in the second pair of magnetic sensors such that each magnetic sensor of the second pair of magnetic sensors has a second level of sensitivity.

12. The apparatus of claim 3, wherein each magnetic sensor in the first pair of magnetic sensors and the second pair of magnetic sensors senses magnetic field in a third direction, wherein the third direction corresponds to the spatial axis corresponding to the conductor, and
   wherein each magnetic sensor in the first pair of magnetic sensors has a different composition than each magnetic sensor of the second pair of sensors.

13. The apparatus of claim 3, wherein each magnetic sensor of the first pair of magnetic sensors has a first angular orientation with respect to a spatial axis corresponding to the conductor, wherein the spatial axis corresponds to a direction of current flow within the conductor, and wherein each magnetic sensor of the second pair of magnetic sensors has a second angular orientation with respect to the spatial axis corresponding to the conductor.

14. The apparatus of claim 1, further comprising:
   a plurality of additional pairs of magnetic sensors, wherein, within each pair of additional magnetic sensors, a first magnetic sensor of the pair has a sensitivity with respect to the magnetic field generated by the current through the conductor that is about equal to a sensitivity of a second magnetic sensor of the pair.

15. The apparatus of claim 14, wherein at least one pair of the plurality of additional pairs of magnetic sensors includes magnetic sensors having a sensitivity with respect to the magnetic field generated by the current through the conductor that is about equal to a sensitivity of the first pair of magnetic sensors.

16. The apparatus of claim 1, wherein, when the flexible material is wrapped around the conductor and the conductor is carrying current, at least a portion of the plurality of magnetic sensors outputs information corresponding to a magnitude of the current based on detection of a magnetic field generated by the current.

17. A sensing apparatus for sensing current through a conductor, the sensing apparatus comprising:
   a plurality of magnetic sensors including at least a first pair of magnetic sensors and a second pair of magnetic sensors, wherein each magnetic sensor of the plurality of magnetic sensors has a sensitivity with respect to a magnetic field generated by the current through the conductor, wherein each magnetic sensor is positioned on a flexible material configured to be wrapped around the conductor in a spiral arrangement, and wherein the flexible material further includes a coupling port; and
   processing circuitry coupled to the plurality of magnetic sensors, wherein the processing circuitry is configured to analyze magnetic field information received from at least one of the plurality of magnetic sensors to determine whether any one of the plurality of magnetic sensors are saturated with magnetic field, wherein the processing circuitry is configured to omit the magnetic field information from any magnetic field sensor determined to be saturated with magnetic field, and wherein the processing circuitry is further configured to transmit information regarding the current flow within the conductor based only on magnetic field information from magnetic field sensors not saturated with magnetic field,
   wherein each magnetic sensor in the plurality of magnetic sensors senses magnetic field in a first direction, wherein the first direction corresponds to a first axis that is perpendicular to a spatial axis corresponding to the conductor, and wherein each magnetic sensor in the plurality of magnetic sensors also senses magnetic field in a second direction, wherein the second direction corresponds to a second axis that is i) perpendicular to the spatial axis corresponding to the conductor and ii) perpendicular to the first axis,
   wherein, when the flexible material is wrapped around the conductor, each magnetic sensor of the first pair of magnetic sensors is positioned a first distance from a spatial axis corresponding to the conductor, wherein the spatial axis corresponds to a direction of current flow within the conductor, and
   wherein, when the flexible material is wrapped around the conductor, each magnetic sensor of the second pair of magnetic sensors is positioned a second distance from the spatial axis for the conductor, wherein the second distance is greater than the first distance.

18. The apparatus of claim 17, wherein, when the flexible material is wrapped around the conductor, the first pair of magnetic sensors includes:
   a first magnetic sensor positioned at a first point on a first virtual circle having a radius equal to the first distance, wherein a center of the first virtual circle corresponds to the spatial axis for the conductor; and
   a second magnetic sensor positioned at a second point on the first virtual circle,
   wherein, when the flexible material is wrapped around the conductor, the second pair of magnetic sensors includes:
   a third magnetic sensor positioned at a first point on a second virtual circle having a radius equal to the second distance, wherein a center of the second virtual circle corresponds to the spatial axis for the conductor; and
   a fourth magnetic sensor positioned at a second point on the second virtual circle.

19. A sensing apparatus for sensing current through a conductor, the sensing apparatus comprising:
   a plurality of magnetic sensors including at least a first pair of magnetic sensors and a second pair of magnetic sensors, wherein each magnetic sensor of the plurality of magnetic sensors has a sensitivity with respect to a magnetic field generated by the current through the conductor, wherein each magnetic sensor is positioned on a material configured to be wrapped around the conductor in a spiral arrangement; and
   wherein each magnetic sensor in the plurality of magnetic sensors senses magnetic field in a first direction, wherein the first direction corresponds to a first axis that is perpendicular to a spatial axis corresponding to the conductor, and wherein each magnetic sensor in the plurality of magnetic sensors also senses magnetic field in a second direction, wherein the second direction corresponds to a second axis that is i) perpendicular to the spatial axis corresponding to the conductor and ii) perpendicular to the first axis,
   wherein, when the material is wrapped around the conductor, each magnetic sensor of the first pair of magnetic sensors is positioned a first distance from a spatial axis corresponding to the conductor, wherein the spatial axis corresponds to a direction of current flow within the conductor, and
   wherein, when the material is wrapped around the conductor, each magnetic sensor of the second pair of magnetic sensors is positioned a second distance from the spatial axis for the conductor, wherein the second distance is greater than the first distance.

20. The apparatus of claim 19, further comprising processing circuitry coupled to the plurality of magnetic sensors, wherein the processing circuitry is configured to analyze magnetic field information received from at least one of the plurality of magnetic sensors to determine whether any one of the plurality of magnetic sensors are saturated with magnetic field, wherein the processing circuitry is configured to omit the magnetic field information from any magnetic field sensor determined to be saturated with magnetic field, and wherein the processing circuitry is further configured to transmit information regarding the current flow within the conductor based only on magnetic field information from magnetic field sensors not saturated with magnetic field.

* * * * *